US010868237B2

(12) United States Patent
Yang et al.

(10) Patent No.: US 10,868,237 B2
(45) Date of Patent: Dec. 15, 2020

(54) SELF-ALIGNED ENCAPSULATION HARD MASK TO SEPARATE PHYSICALLY UNDER-ETCHED MTJ CELLS TO REDUCE CONDUCTIVE R-DEPOSITION

(71) Applicant: Taiwan Semiconductor Manufacturing Company, Ltd., Hsinchu (TW)

(72) Inventors: Yi Yang, Fremont, CA (US); Dongna Shen, San Jose, CA (US); Vignesh Sundar, Fremont, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/113,079

(22) Filed: Aug. 27, 2018

(65) Prior Publication Data

US 2020/0066972 A1 Feb. 27, 2020

(51) Int. Cl.
*H01L 43/12* (2006.01)
*H01F 10/32* (2006.01)
(Continued)

(52) U.S. Cl.
CPC ......... *H01L 43/12* (2013.01); *H01F 10/3254* (2013.01); *H01F 41/34* (2013.01);
(Continued)

(58) Field of Classification Search
CPC ......... H01L 43/02; H01L 43/08; H01L 43/12; H01L 27/222
See application file for complete search history.

(56) References Cited

U.S. PATENT DOCUMENTS 8,883,520 B2  11/2014  Satoh et al.
9,502,466 B1  11/2016  Chuang et al.
(Continued)

FOREIGN PATENT DOCUMENTS

JP   2004128229 A   4/2004
KR   20180063183 A   6/2018
TW   201742241 A   12/2017

OTHER PUBLICATIONS

Korean Intellectual Property Office, Korean Office Action dated Oct. 23, 2020, for Application No. 10-2019-0104731, filed Aug. 26, 2019; Applicant: Taiwan Semiconductor Manufacturing Company, Ltd., 5 pages.

*Primary Examiner* — David C Spalla
(74) *Attorney, Agent, or Firm* — Haynes and Boone, LLP

(57) ABSTRACT

A method for etching a magnetic tunneling junction (MTJ) structure is described. A MTJ stack is deposited on a bottom electrode wherein the MTJ stack comprises at least a pinned layer, a barrier layer on the pinned layer, and a free layer on the barrier layer, A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

20 Claims, 2 Drawing Sheets

(51) Int. Cl.
    *H01F 41/34*     (2006.01)
    *H01L 43/02*     (2006.01)
    *G11C 11/16*     (2006.01)
    *H01L 27/22*     (2006.01)

(52) U.S. Cl.
    CPC ............ *H01L 43/02* (2013.01); *G11C 11/161* (2013.01); *H01L 27/222* (2013.01)

(56) References Cited

U.S. PATENT DOCUMENTS

| | | | |
|---|---|---|---|
| 9,722,174 | B1 | 8/2017 | Nagel et al. |
| 9,793,126 | B2 | 10/2017 | Dhindsa et al. |
| 2006/0261425 | A1* | 11/2006 | Suemitsu ................ H01L 43/08 257/421 |
| 2016/0225981 | A1* | 8/2016 | Deshpande ............. H01L 43/12 |
| 2017/0062699 | A1* | 3/2017 | Huang .................... H01L 43/10 |
| 2017/0301857 | A1 | 10/2017 | Mudivarthi et al. |
| 2018/0358547 | A1* | 12/2018 | Yang ..................... H01L 27/224 |

\* cited by examiner

SELF-ALIGNED ENCAPSULATION HARD MASK TO SEPARATE PHYSICALLY UNDER-ETCHED MTJ CELLS TO REDUCE CONDUCTIVE R-DEPOSITION

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another.

However, the high energy ions can also react with the non-removed materials, oxygen, moisture and other chemicals laterally, causing sidewall damage and lowering device performance. To solve this issue, pure physical etching techniques such as Ar RIE or ion beam etching (IBE) have been applied to etch the MTJ stack. However, due to the non-volatile nature, physically etched conductive materials in the MTJ and bottom electrode can form a continuous path across the tunnel barrier, resulting in shorted devices. A new approach to overcome this dilemma is thus needed if one wants to unleash the full potential of this physical etch to pattern the future sub 60 nm MRAM products.

Several references teach multi-step etching methods to form MTJ's, including U.S. Pat. No. 9,793,126 (Dhindsa et al), U.S. Pat. No. 9,722,174 (Nagel et al), and U.S. Pat. No. 8,883,520 (Satoh et al). All of these references are different from the present disclosure.

SUMMARY

It is an object of the present disclosure to provide an improved method of forming MTJ structures.

Yet another object of the present disclosure is to provide a method of forming MTJ devices using a physical under-etch to avoid both chemical damage and physical shorts.

A further object of the present disclosure is to provide a method of forming MTJ devices using a physical underetch to avoid both chemical damage and physical shorts where separate and non-interacting MTJ cells are made using encapsulation material as a self-aligned process.

In accordance with the objectives of the present disclosure, a method for etching a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned or the seed layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

BRIEF DESCRIPTION OF THE DRAWINGS

In the accompanying drawings forming a material part of this description, there is shown.

DETAILED DESCRIPTION

In a typical process, the whole MTJ stack is patterned by a single step of etch, either by chemical RIE or physical Ar RIE or IBE. It therefore creates either chemical damage or physical shorts on the MTJ sidewall. In the process of the present disclosure, we first partially etch the MTJ stack to minimize the physical re-deposition. Then, using encapsulation material as a self-aligned hard mask, the remaining MTJ is etched. This new process avoids chemical damage and physical shorts simultaneously. Moreover, the second step of etch is a self-aligned process, meaning it does not require a complicated photolithography step, where the overlay is hard to control, especially for sub 60 nm MRAM devices.

In the process of the present disclosure, the MTJ stack is first partially etched by a physical etch such as RIE or IBE using different gas plasma such as Ar and Xe, so that there is no chemical damage but only conductive re-deposition on the sidewall. The amount of re-deposition is dependent on the etch amount. By intentionally under etching, e.g., only etching away the free layer, tunnel barrier and/or part of the pinned or the seed layer, the re-deposition on the tunnel barrier sidewall can be significantly reduced or totally removed. An encapsulation material is deposited to protect the earlier etched MTJ. A RIE or IBE etch partially clears out the portion of encapsulation material that is on top and bottom of the MTJ patterns. Next, using the encapsulation material left on the MTJ sidewalls as a self-aligned hard mask, the remaining MTJ is etched, creating separate and non-interacting MTJ cells. Regardless of what type of etch is used, the free layer and tunnel barrier layer would not be affected by this step due to the encapsulation material's protection, thus preserving high device performance.

Figure 1:
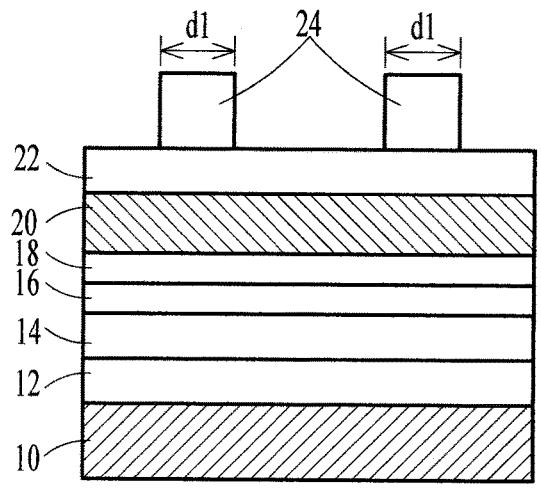
FIGS. 1 through 6 illustrate in cross-sectional representation steps in a preferred embodiment of the present disclosure.

Referring now to FIGS. 1 through 6, the novel method of the present disclosure will be described in detail. Referring now more particularly to FIG. 1, there is shown a bottom electrode 10 formed on a substrate, not shown. Now, layers are deposited on the bottom electrode to form a magnetic tunnel junction. For example, seed layer 12, pinned layer 14, tunnel barrier layer 16, and free layer 18 are deposited.

There may be one or more pinned, barrier, and/or free layers. A metal hard mask 20, such as Ta, TaN, Ti, TiN, W, Cu, Mg, Ru, Cr, Co, Fe, Ni or their alloys, is deposited to a thickness of 10-100 nm, and preferably ≥50 nm, on top of the MTJ stack. This hard mask will be used as a top electrode. Finally, a dielectric hard mask material 22, such as $SiO_2$, SiN, SiON, SiC or SiCN, is deposited to a thickness of ≥20 nm onto the top electrode 20. Photoresist is patterned by 248 nm photolithography, for example, to form photoresist pillar patterns 24 with size d1 of ~70-80 nm and height ≥200 nm.

Figure 2:
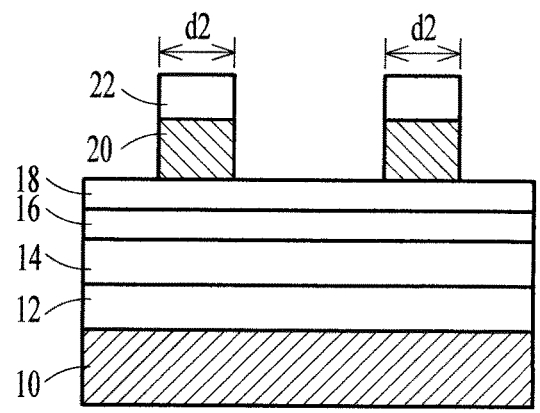

Now, as illustrated in FIG. 2, the dielectric and metal hard masks 22 and 20 are etched by a fluorine carbon based plasma such as $CF_4$ or $CHF_3$ alone, or mixed with Ar and $N_2$. $O_2$ can be added to reduce the pillar size d2 from 50-60 nm to 30-40 nm. They can also be etched by physical RIE or IBE (pure Ar), followed by large angle (70-90° with respect to the pillar's normal line) IBE trimming, forming pillar size d2 of 30-40 nm.

Figure 3:
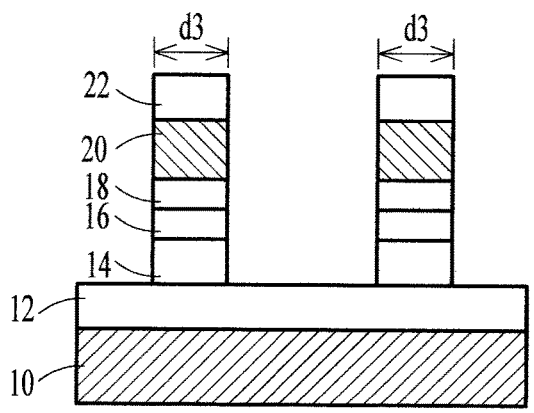

Referring now to FIG. 3, the MTJ stack is partially etched using physical RIE (pure Ar or Xe) or IBE stopping either on the pinned layer or the seed layer with similar pattern size, to minimize the metal re-deposition on the tunnel barrier. Because of the nature of a physical etch, there is no chemical damage. The height h of the partially etched MTJ stack is between about 5 and 30 nm.

Figure 4:
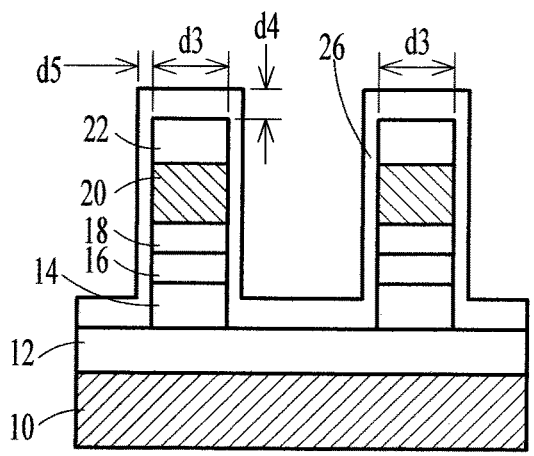
Figure 5:
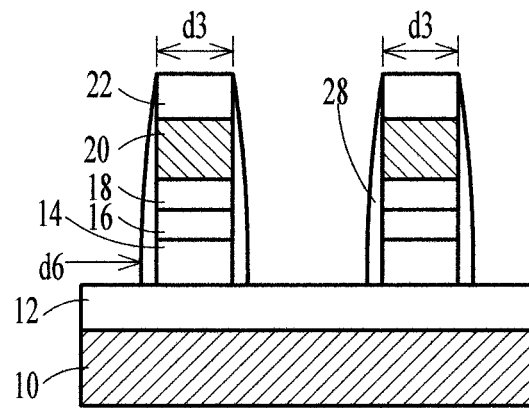

Now, as illustrated in FIG. 4, an encapsulation material 26 made of dielectric materials such as SiN, SiC, SiCN, carbon, or TaC or metal oxides such as $Al_2O_3$ or MgO with thickness d4 of 5-30 nm, is either in-situ or ex-situ deposited by CVD, PVD or ALD onto the partially etched MTJ patterns. The portion of the encapsulation material on top and bottom of the patterns is etched away by RIE or IBE, leaving encapsulation spacers 28 on the sidewalls, as shown in FIG. 5, having a thickness d6 of 10-30 nm. Depending on the material used for the spacer, different plasma can be used for this etching step. For example, a fluorine carbon based plasma such as $CF_4$ or $CHF_3$ can be used for SiN, SiC, and SiCN, $O_2$ can be applied for carbon, a fluorine carbon such as $CF_4$ or $CHF_3$ or a halogen such as $Cl_2$, or their combination, can be used for TaC, and a halogen such as $Cl_2$ alone or mixed with Ar can be used for $Al_2O_3$ and MgO.

Figure 6:
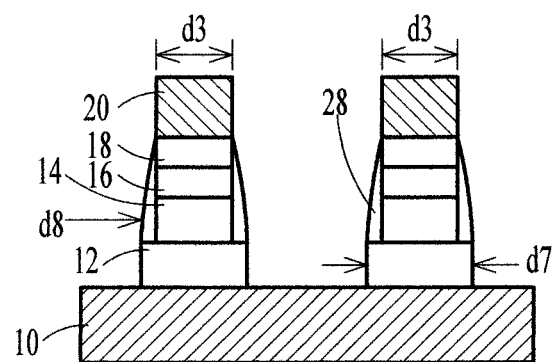

Finally using the encapsulation 28 left on the sidewalls of the MTJ patterns as a self-aligned hard mask, as shown in FIG. 6, the remaining MTJ stack such as the pinned layer 14 and/or seed layer 12 can be etched by RIE or IBE. When a RIE etch is used, since the pinned layer and seed layer fabricated by this method are larger than the free layer, the chemical damage on the pinned layer and seed layer would not affect its central portion which is aligned with the free layer. When physical RIE or IBE is used, the metal re-deposition from the pinned and seed layers would not be in contact with the tunnel barrier due to the encapsulation's protection. Note that this pinned and seed layer etch is a self-aligned step, meaning it has no overlay control issue, which is usually associated with sub 60 nm MRAM device fabrication.

More importantly, the pinned and seed layers' sizes are greatly dependent on the thickness of the encapsulation sidewall serving as the hard mask, which is determined by its initial deposition thickness and later etch conditions. By tuning these parameters, one can precisely control the pinned and seed layers' sizes according to the device design. For instance, one can create a thick spacer having a thickness d8 of 10-20 nm on the free layer's sidewall so that the later defined tunnel barrier and pinned layers are of the size d7 of 50-60 nm, larger than the free layer d3 of 40-50 nm. This is particularly critical for small cell size devices since it allows for strong pinning strength, increasing the energy barrier and reducing the switching current.

In summary, the process of the present disclosure uses a physical under etch to avoid both chemical damage and physical shorts. Moreover, separate and non-interacting MTJ cells are made using encapsulation material as a self-aligned process, meaning it has no overlay control issue, which is usually associated with sub 60 nm MRAM device fabrication. It is thus possible to replace the widely used chemical RIE etch, which inevitably brings chemical damage on the MTJ sidewall. This process will be used for MRAM chips of the size smaller than 60 nm as problems associated with chemically damaged sidewalls and re-deposition from the MTJ stack and bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure comprising:
    depositing a MTJ stack on a bottom electrode wherein said MTJ stack comprises at least a pinned layer, a barrier layer on said pinned layer, and a free layer on said barrier layer;
    depositing a top electrode layer on said MTJ stack;
    depositing a hard mask on said top electrode layer;
    first etching said top electrode layer and said hard mask with a first etch process;
    thereafter second etching said MTJ stack using the hard mask as a mask and stopping said etching at or within said pinned layer with a second etch process different from the first etch process;
    thereafter depositing an encapsulation layer over partially etched said MTJ stack and said hard mask and etching away said encapsulation layer on horizontal surfaces leaving a self-aligned hard mask on sidewalls of said partially etched MTJ stack; and
    thereafter third etching remaining said MTJ stack not covered by said hard mask and said self-aligned hard mask to complete said MTJ structure.

2. The method according to claim 1 wherein said top electrode layer comprises Ta, TaN, Ti, TiN, W, Cu, Mg, Ru, Cr, Co, Fe, Ni or their alloys and said hard mask comprises SiO2, SiN, SiON, SiC or SiCN.

3. The method according to claim 1 wherein the first etch process for etching said hard mask and said top electrode includes a fluorine carbon based plasma comprising $CF_4$ or $CHF_3$ alone, or mixed with Ar and $N_2$.

4. The method according to claim 3 wherein the second etch process for etching said second includes a physical reactive ion etching using Ar or Xe gas plasma or ion beam etching.

5. The method according to claim 1 wherein there is no chemical damage to sidewalls of said MTJ stack and wherein any first conductive metal re-deposition after said second etching and second conductive metal re-deposition after said third etching are separated from each other by said self-aligned hard mask.

6. The method according to claim 1 wherein said depositing said encapsulation layer comprises depositing a dielectric layer comprising SiN, SiC, SiCN, carbon, or TaC or a metal oxide layer comprising $Al_2O_3$ MgO in-situ or ex-situ by chemical vapor deposition (CVD), physical vapor deposition (PVD), or atomic layer deposition (ALO) to a thickness of 5-30 nm.

7. The method according to claim 1 wherein a pattern size of said pinned layer is controlled by tuning a thickness of said self-aligned hard mask.

8. The method according to claim 1 wherein a pattern size of said pinned layer is larger than a pattern size of said free layer.

9. A method for fabricating a magnetic tunneling junction (MTJ) structure comprising:
    depositing a MTJ stack on a bottom electrode wherein said MTJ stack comprises at least a seed layer, a pinned layer on said seed layer, a barrier layer on said pinned layer, and a free layer on said barrier layer;

depositing a top electrode layer on said MTJ stack;

depositing a hard mask on said top electrode layer;

first etching said top electrode layer and said hard mask;

thereafter second etching said MTJ stack not covered by said hard mask and stopping said etching at or within said pinned layer or said seed layer;

thereafter depositing an encapsulation layer over partially etched said MTJ stack and said hard mask and etching away said encapsulation layer on horizontal surfaces leaving a self-aligned hard mask on sidewalls of said partially etched MTJ stack, including sidewalls of said pinned layer; and thereafter third etching remaining said MTJ stack not covered by said hard mask and said self-aligned hard mask to complete said MTJ structure.

10. The method according to claim 9 wherein a pattern size of said pinned layer is larger than a pattern size of said free layer.

11. The method according to claim 9 wherein said top electrode layer comprises Ta, TaN, Ti, TiN, W, Cu, Mg, Ru, Cr, Co, Fe, Ni or their alloys and said hard mask comprises SiO2, SiN, SiON, SiC or SiCN.

12. The method according to claim 9 wherein said hard mask and said top electrode are etched by a fluorine carbon based plasma comprising $CF_4$ or $CHF_3$ alone, or mixed with Ar and $N_2$, wherein $O_2$ is optionally added to reduce a pattern size of said hard mask, or by physical RIE or IBE, followed by large angle IBE trimming to reduce a pattern size of said hard mask.

13. The method according to claim 9 wherein said second and third etching comprise a physical reactive ion etching using Ar or Xe gas plasma or ion beam etching.

14. The method according to claim 9 wherein there is no chemical damage to sidewalls of said MTJ stack and wherein any first conductive metal re-deposition after said second etching and second conductive metal re-deposition after said third etching are separated from each other by said self-aligned hard mask.

15. The method according to claim 9 wherein said depositing said encapsulation layer comprises depositing a dielectric layer comprising SiN, SiC, SiCN, carbon, or Tac or a metal oxide layer comprising Al2O 3 or MgO in-situ or ex-situ by CVD, PVD, or ALD to a thickness of 5-30 nm.

16. The method according to claim 9 wherein a pattern size of said pinned layer is controlled by tuning a thickness of said self-aligned hard mask.

17. A magnetic tunneling junction (MTJ) structure comprising:
separate and non-interacting MTJ cells on a bottom electrode, wherein each said MTJ cell comprises:
a seed layer over said bottom electrode, a pinned layer over said seed layer, a barrier layer over said pinned layer, and a free layer over said barrier layer, said seed layer having a top surface facing away from said bottom electrode;
sidewall spacers disposed along sidewalls of said pinned layer and extending to a physically contacting said top surface of said seed layer, and
a top electrode over said free layer.

18. The structure according to claim 17 wherein said sidewall spacers comprise a dielectric layer comprising SiN, SiC, SiCN, carbon, or TaC or a metal oxide layer comprising $Al_2O_3$ or MgO.

19. The structure according to claim 17 wherein a pattern size of said pinned layer or said pinned layer and said seed layer is larger than a pattern size of said free layer.

20. The structure according to claim 17, wherein the top electrode has a first sidewall surface and an opposing second sidewall surface, and
wherein a first portion of said first sidewall surface is free of said sidewall spacers and a second portion of said second sidewall surface is free of said sidewall spacers.

* * * * *